(12) United States Patent
Fonteneau (10) Patent No.: US 9,530,922 B2
(45) Date of Patent: Dec. 27, 2016

(54) OVERVOLTAGE PROTECTION COMPONENTS IN AN OPTOELECTRONIC CIRCUIT ON SOI

(71) Applicant: STMICROELECTRONICS SA, Montrouge (FR)

(72) Inventor: Pascal Fonteneau, Theys (FR)

(73) Assignee: STMICROELECTRONICS SA, Montrouge (FR)

( * ) Notice: Subject to any disclaimer, the term of this patent is extended or adjusted under 35 U.S.C. 154(b) by 90 days.

(21) Appl. No.: 14/496,192

(22) Filed: Sep. 25, 2014

(65) Prior Publication Data

US 2015/0084092 A1   Mar. 26, 2015

(30) Foreign Application Priority Data

Sep. 26, 2013   (FR) ..................................... 13 59287

(51) Int. Cl.

| | |
|---|---|
| H01L 31/111 | (2006.01) |
| H01L 31/0232 | (2014.01) |
| H01L 31/18 | (2006.01) |
| H01L 31/11 | (2006.01) |
| H01L 31/02 | (2006.01) |
| H01L 27/12 | (2006.01) |
| H01L 31/028 | (2006.01) |
| H01L 31/105 | (2006.01) |

(52) U.S. Cl.
CPC ....... *H01L 31/1113* (2013.01); *H01L 27/1203* (2013.01); *H01L 31/028* (2013.01); *H01L 31/02019* (2013.01); *H01L 31/02327* (2013.01); *H01L 31/105* (2013.01); *H01L 31/11* (2013.01); *H01L 31/18* (2013.01)

(58) Field of Classification Search
CPC .. H01L 27/1203; H01L 31/0237; H01L 31/11; H01L 31/1113; G02F 1/025; G02B 6/12004
See application file for complete search history.

(56) References Cited

U.S. PATENT DOCUMENTS

| | | |
|---|---|---|
| 2005/0077577 A1 | 4/2005 | Manna et al. |
| 2005/0110060 A1 | 5/2005 | Shiu et al. |
| 2008/0080803 A1* | 4/2008 | Park ........................ G02F 1/015 385/2 |

FOREIGN PATENT DOCUMENTS

EP   0677874 A1   10/1995

* cited by examiner

*Primary Examiner* — Tucker J Wright
(74) *Attorney, Agent, or Firm* — Allen, Dyer, Doppelt, Milbrath & Gilchrist, P.A.

(57) ABSTRACT

An overvoltage protection component may be in a SOI layer, a portion of the SOI layer forming the core of an optical waveguide. This component may be made of semiconductor regions of different doping types and/or levels, at least one of these regions corresponding to at least a portion of the waveguide core.

27 Claims, 7 Drawing Sheets

(Prior Art)

OVERVOLTAGE PROTECTION COMPONENTS IN AN OPTOELECTRONIC CIRCUIT ON SOI

RELATED APPLICATIONS

This application claims priority to French Patent application number 13/59287, filed on Sep. 26, 2013, which is hereby incorporated by reference in its entirety.

TECHNICAL FIELD

The present disclosure relates to components for protection against overvoltages in an optoelectronic component formed in a silicon-on-insulator (SOI) layer.

BACKGROUND

Generally, to protect a component against overvoltages, for example, during electrostatic discharges that may occur while the component is not connected, a protection component connected across the component to be protected is used. Such a protection component may, for example, be an avalanche diode, a bipolar transistor, or a unidirectional or bidirectional Shockley diode.

Figure 1A:
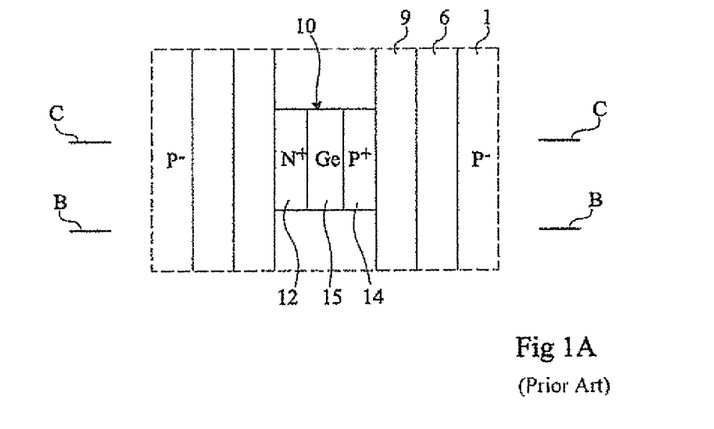
FIG. 1A is a top plan view of an optoelectronic device, according to the prior art.
Figure 1B:
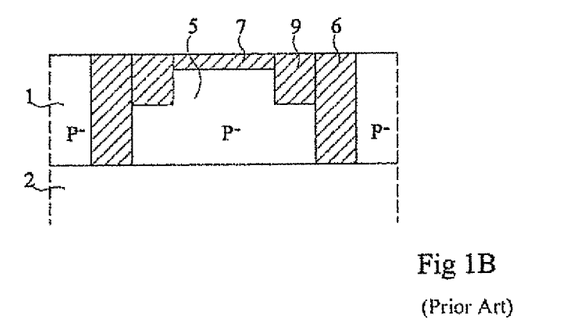
FIGS. 1B and 1C are cross-section views of the optoelectronic device of FIG. 1A along planes BB and CC, respectively.
Figure 1C:
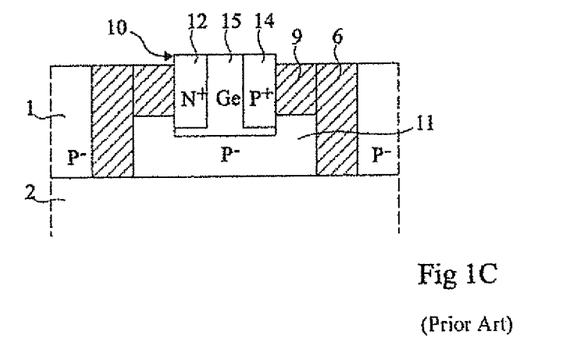

FIGS. 1A, 1B, and 1C show a portion of an optoelectronic circuit. A thin lightly-doped P-type silicon layer 1 (P−) is formed on an oxide layer 2, currently called BOX ("Buried Oxide") layer. Layer 1, currently called SOI layer, comprises a portion entirely surrounded with silicon oxide, which forms core 5 of a waveguide. Core 5, being supported by oxide layer 2, is laterally delimited by two trenches 6 filled with oxide crossing silicon layer 1 and is covered with an upper oxide layer. In the illustrated example, the upper oxide layer comprises a central portion 7 surrounded with two lateral portions 9 deeper than the central portion 7. The central portion 7, which is shallower, results from a thermal oxidation and the lateral portions correspond to trenches filled with oxide, which do not cross the SOI layer 1.

In the following, a dimension of an element will be considered as being its width if this dimension is parallel to the width of the waveguide. The length of an element will be defined in the same way relative to the waveguide length.

FIGS. 1A and 1C show a portion of the waveguide where a germanium photodiode 10 is arranged along a portion of the waveguide length. Photodiode 10 is formed of a germanium block formed by epitaxy above a portion 11 of core 5. In the germanium block are formed, on the left-hand side of the drawings, a heavily-doped N-type cathode region 12 (N+) and, on the right-hand side of the drawings, a heavily-doped P-type anode region 14 (P+). Cathode 12 and anode 14 are separated by an intrinsic germanium or lightly-doped N- or P-type germanium region 15.

Figure 2:
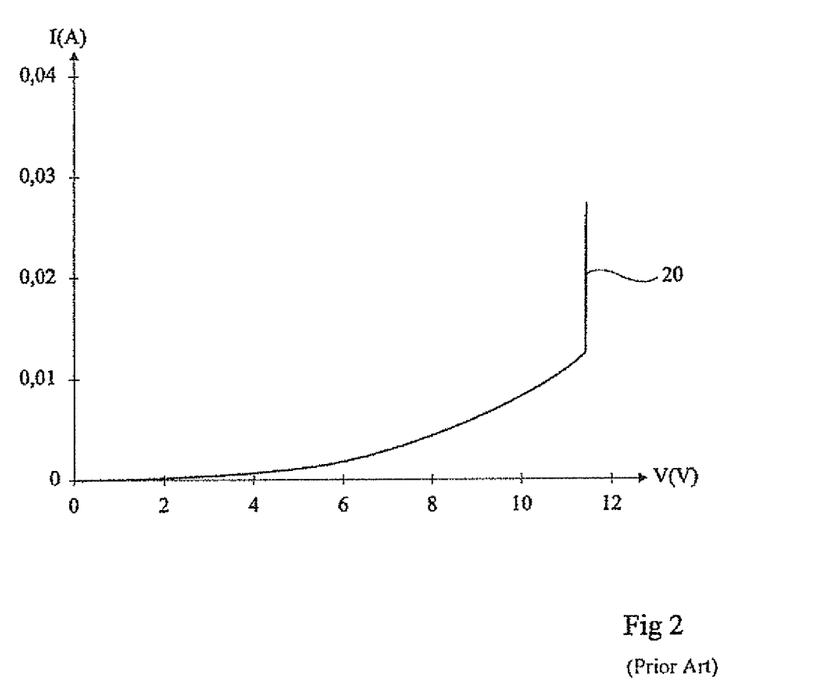
FIG. 2 is a current-voltage characteristic of a photodiode in an overload, according to the prior art.

FIG. 2 is a curve 20 illustrating a current-voltage characteristic of an example of photodiode 10. Curve 20 characterizes the robustness of photodiode 10 against electrostatic discharges. Each point of curve 20 indicates current I (in Amperes) running through photodiode 10 for a 100-ns voltage step V (in volts). Up to an 11.5-V amplitude, current I increases slowly as a function of amplitude V of the voltage steps. As soon as applied voltage V exceeds 11.5 V, current I very strongly increases: this behavior corresponds to the breakdown of photodiode 10. A similar behavior can be observed with different values, whatever the specific structure of photodiode 10.

SUMMARY

An overvoltage protection component may include a SOI layer, an optical waveguide core in the SOI layer, and a plurality of semiconductor regions in the SOI layer and adjacent the optical waveguide core. The optical waveguide core and the plurality of semiconductor regions may define alternating regions of different conductivity types and dopant concentration levels.

DETAILED DESCRIPTION

Thus, an overvoltage protection component may be formed in a SOI layer, a portion of the SOI layer forming the core of an optical waveguide. This component is made of alternating semiconductor regions of different doping types and/or levels, one at least of these regions corresponding to at least a portion of the waveguide core.

According to an embodiment, the core has a first conductivity type and a first region and a second region of the second conductivity type are arranged on either side of said portion of the core, the first region, the core portion, and the second region being formed in the SOI layer and altogether forming a bipolar transistor. Also, the core has a first conductivity type, a first region and a third region respectively of the second conductivity type and of the first conductivity type are successively arranged on one side of said portion of the core, and a second region of the second conductivity type is arranged on the other side of the core portion, the third region, the first region, the core portion, and the second region being formed in the SOI layer and altogether forming a unidirectional Shockley diode.

According to an embodiment, above the first region, a contacting region crosses an upper insulating layer and forms a contact with the first region. The core has a first conductivity type, and a first region and a third region respectively of the second conductivity type and of the first conductivity type are successively arranged on one side of said portion of the core. A second region and a fourth region respectively of the second and of the first conductivity type are successively arranged on the other side of the core portion, the third region, the first region, the core portion, the second region and the fourth region being formed in the SOI layer and altogether forming a bidirectional Shockley diode.

Additionally, at least one area is interposed between the core and the first region, the at least one area having a same conductivity type as the first region and a different doping level. Additionally, a contact is formed partly in the waveguide core and enables to bias the core portion.

Also, a region of the same conductivity type as the core and of higher doping level forms a contact between the first region and a portion of said contact formed in the core. An embodiment provides a device formed of a protection component such as hereinabove, of said optical waveguide, and of a germanium photodiode, the photodiode being arranged in contact with and above the core portion and being connected to the protection component.

For clarity, the same elements have been designated with the same reference numerals in the various drawings and, further, as usual in the representation of integrated circuits, the various drawings are not to scale. The foregoing and other features and advantages will be discussed in detail in the following non-limiting description of specific embodiments in connection with the accompanying drawings.

Figure 3A:
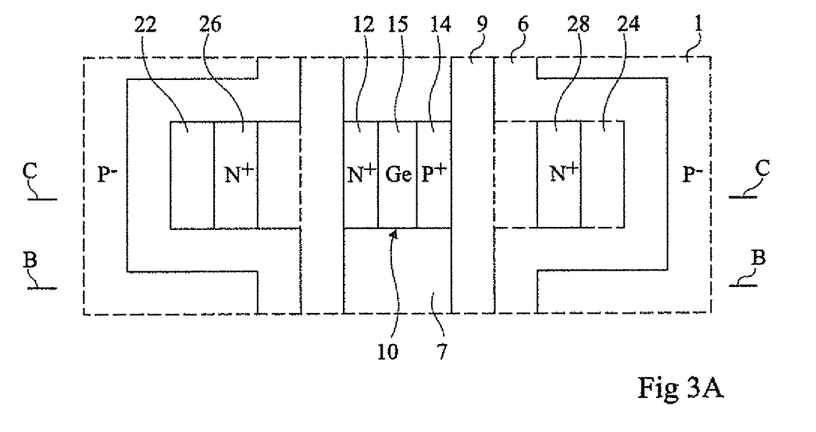
FIG. 3A is a top plan view of an embodiment of a protection component of a bipolar type.
Figure 3B:
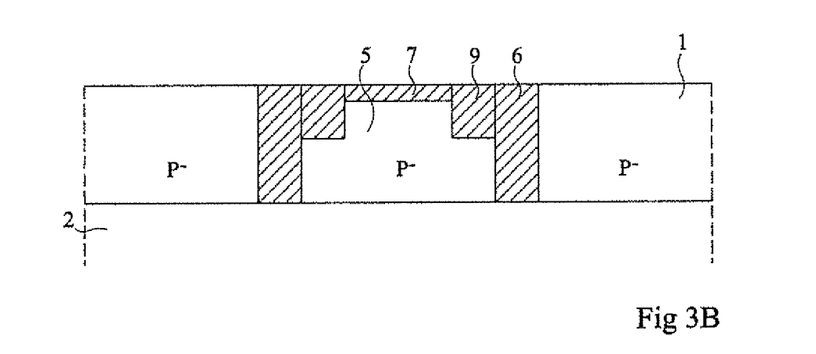
FIGS. 3B and 3C are cross-section views of the protection component of FIG. 3A along plane BB and plane CC, respectively.
Figure 3C:
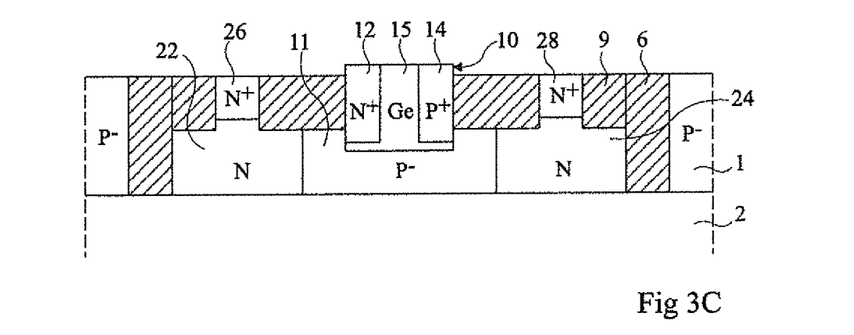

FIGS. 3A, 3B, and 3C show an embodiment of a protection component of bipolar transistor type. This component is integrated to the waveguide coated with the typical germanium detection photodiode 10 of FIGS. 1A, 1B, and 1C.

The cross-section view of FIG. 3B, drawn outside of portion 11 of core 5 having photodiode 10 formed thereon, is identical to that of FIG. 1B. It shows the same elements, that is, a waveguide formed of a silicon core 5 surrounded with silicon oxide. In FIGS. 3A and 3C, to the left of portion 11 of core 5 and in contact therewith, an N-type doped region 22 is formed in SOI layer 1. To the right of portion 11 of core 5 and in contact therewith, an N-type doped region 24 is formed in SOI layer 1. Trenches 6 follow the contour of the assembly formed of region 22, of region 24, and of core 5.

Above region 22, a heavily-doped N-type silicon region 26 (N+) crosses upper insulating layer 9 and forms a contact with region 22. Similarly, above region 24, a heavily-doped N-type silicon region 28 (N+) crosses upper insulating layer 9 and forms a contact with region 24.

Region 22, portion 11 of core 5, and region 24 respectively form the collector, base, and emitter regions of a bipolar transistor. Metallizations (not shown) enable connection of the collector contact region 26 and the cathode 12 of photodiode 10, and the emitter contact region 28 and the anode 14 of photodiode 10. This transistor, having a floating base in the illustrated embodiment, operates as a protection between its collector and its emitter.

Figure 4A:
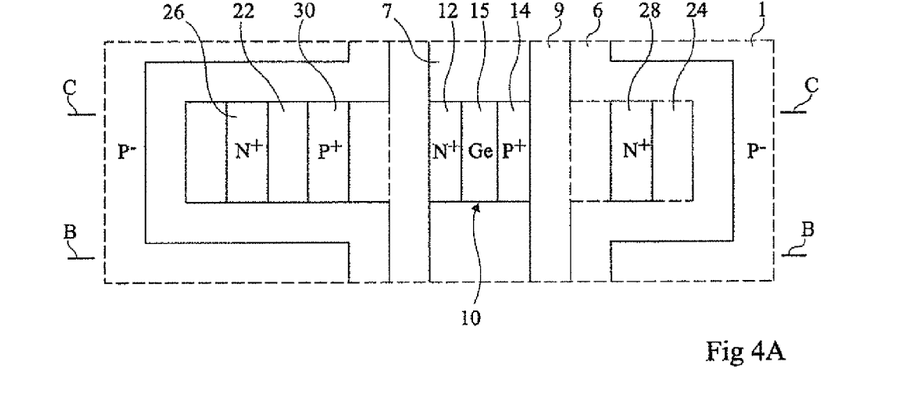
FIG. 4A is a top plan view of another embodiment of a protection component of unidirectional Shockley diode type.
Figure 4B:
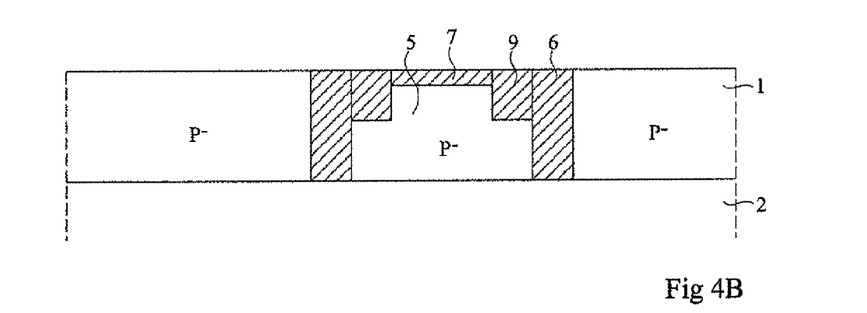
FIGS. 4B and 4C are cross-section views of the protection component of FIG. 4A along plane BB and plane CC, respectively.
Figure 4C:
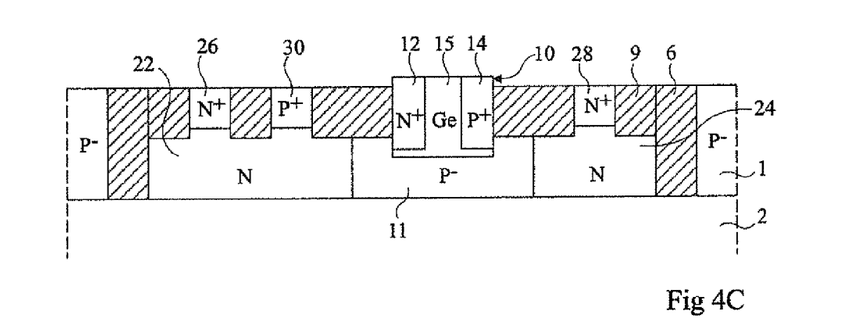

FIGS. 4A, 4B and 4C show an embodiment of a protection component of unidirectional Shockley diode type (or gateless thyristor). The views of FIGS. 4A, 4B and 4C illustrate the same elements as the views of FIGS. 3A, 3B, and 3C, designated with the same reference numerals. In FIGS. 4A and 4C, a heavily-doped P-type silicon region 30 (P+) crosses upper oxide layer 9 above region 22 and forms a contact therewith. Region 30 is separated from region 26 by a portion of upper insulating layer 9.

Region 30, region 22, portion 11 of core 5, and region 24 respectively form the anode, anode gate, cathode gate and cathode regions of a unidirectional Shockley diode having its anode 30 and its cathode 24 connected to terminals 12 and 14 of photodiode 10 by metallizations (not shown). Additionally, region 26, i.e. region 22, may be connected to the anode region of the Shockley diode to adjust its turn-on threshold.

Figure 5A:
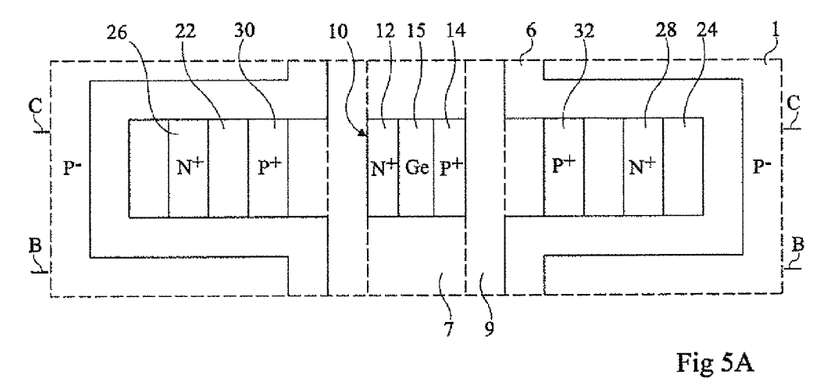
FIG. 5A is a top plan view of an embodiment of a protection component of bidirectional Shockley diode type.
Figure 5B:
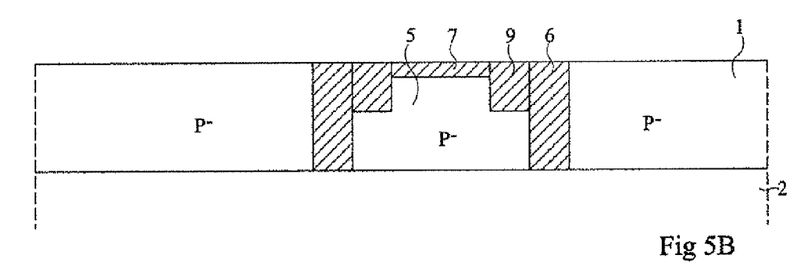
FIGS. 5B and 5C are cross-section views of the protection component of FIG. 5A along plane BB and plane CC, respectively.
Figure 5C:
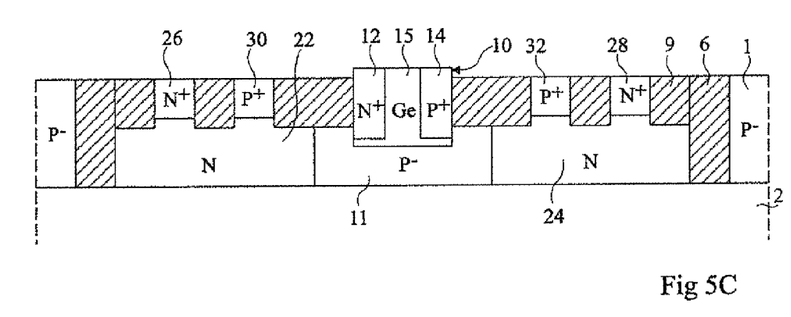

FIGS. 5A, 5B and 5C show an embodiment of a protection component of bidirectional Shockley diode type (or two gateless thyristors connected in antiparallel). The views of FIGS. 5A, 5B, and 5C illustrate the same elements as the views of FIGS. 4A, 4B, and 4C, designated with the same reference numerals.

In FIGS. 5A and 5C, a heavily-doped P-type silicon region 32 (P+) crosses upper oxide layer 9 above region 24 and forms a contact therewith. Region 32 is separated from region 28 by a portion of upper insulating layer 9. Region 30, region 22, portion 11 of core 5, and region 24 respectively form the anode, anode gate, cathode gate and cathode regions of a first thyristor. Region 32, region 24, portion 11 of core 5, and region 22 respectively form the anode, anode gate, cathode gate and cathode regions of a second thyristor. Metallizations (not shown) enable to connect, on the one hand, anode 30 of first thyristor to cathode 12 of photodiode 10 and, on the other hand, anode 32 of the second thyristor to anode 14 of photodiode 10. Region 26 is connected to region 30 and region 28 is connected to region 32. The connection of the two thyristors in antiparallel forms a bidirectional Shockley diode.

Figure 6A:
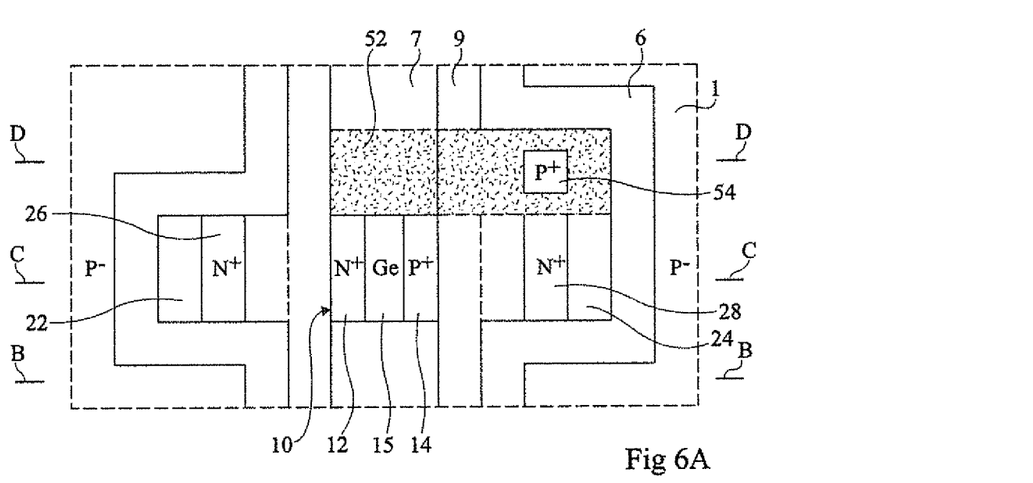
FIG. 6A is a top plan view of another embodiment of a protection component of transistor type.
Figure 6B:
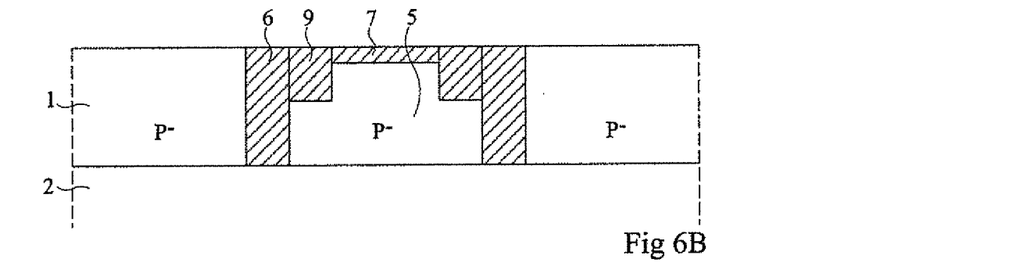
FIGS. 6B, 6C, and 6D are cross-section views of the protection component of FIG. 6A along planes BB, CC, and DD, respectively.
Figure 6C:
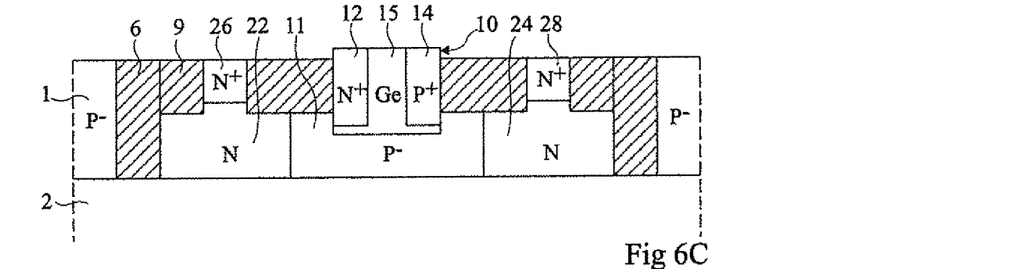

FIGS. 6A, 6B, 6C, and 6D illustrate an embodiment of a protection component of bipolar transistor type similar to that described in relation with FIGS. 3A, 3B, and 3C. The cross-section views of FIGS. 6B and 6C are identical, respectively, to the cross-section views of FIGS. 3B and 3C. It shows the same elements, designated with same reference numerals.

Figure 6D:
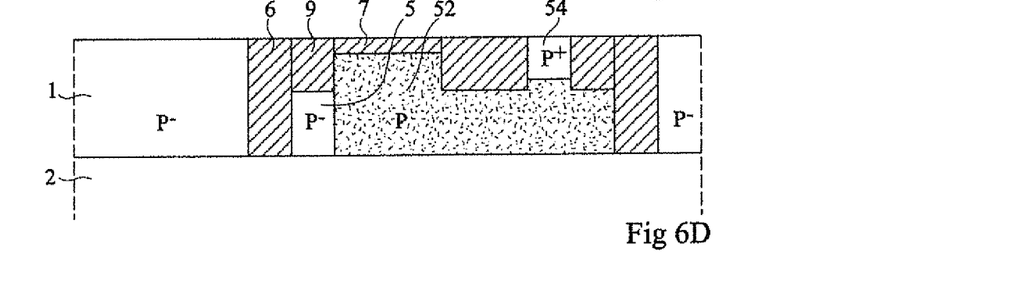

In FIGS. 6A and 6D, a P-type doped silicon region 52 is formed in a portion of core 5 near to portion 11 and extends on one side thereof, to the right of the drawings. Region 52 runs along the entire width of region 24. A heavily-doped P-type region 54 (P+) crosses upper insulating layer 9 and forms a contact with region 52. Trenches 6 follow the contour of the assembly formed of region 22, of region 24, of region 52, and of core 5.

In this embodiment, region 52 and region 54 form a contact towards core 5 enabling to apply a potential to core 5, more specifically to portion 11 of core 5. It should be noted that this contact may be formed in another portion of the waveguide or added to the previously-described embodiments of the unidirectional or bidirectional Shockley diode.

Figure 7A:
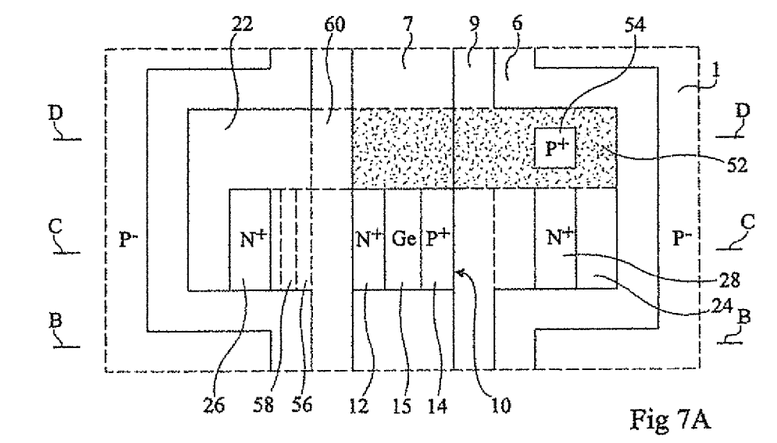
FIG. 7A is a top plan view of another embodiment of a protection component of transistor type.
Figure 7B:
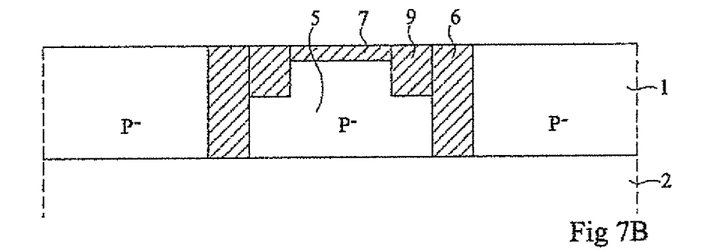
FIGS. 7B, 7C, and 7D are cross-section views of the protection component of FIG. 7A along planes BB, CC, and DD, respectively.

FIGS. 7A, 7B, 7C, and 7D illustrate a second embodiment of a protection component of bipolar transistor type described in relation with FIGS. 3A, 3B, and 3C. The cross-section view of FIG. 7B is identical to the cross-section views of FIGS. 1B, 3B, 4B, 5B, and 6B and it shows the same elements, designated with the same reference numerals.

Figure 7C:
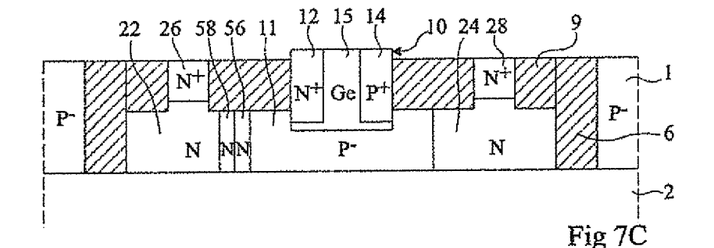

In FIGS. 7A and 7C, two successive areas 56 and 58 are arranged in region 22. Area 56 is bordered on one side by portion 11 of core 5 and on the other side by area 58. Area 58 is bordered on one side by region 56 and on the other side by region 22. A portion of region 22 crosses regions 56 and 58 across a portion of their length, at the top of FIG. 7A. Silicon areas 56 and 58 of the same conductivity type as region 22 have doping levels different from that of region 22.

Figure 7D:
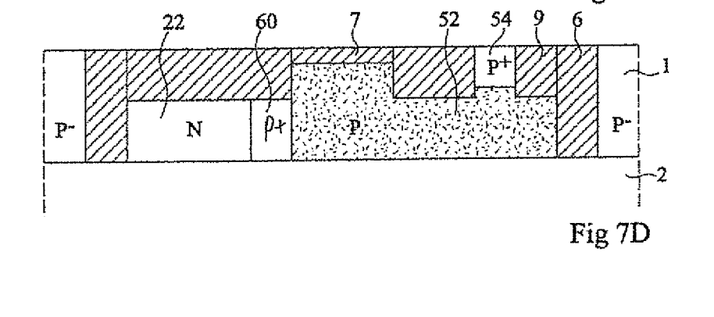

In FIGS. 7A and 7D, a P-type doped silicon region 52 is formed in a portion of core 5 close to portion 11 and extends to the right thereof. Region 52 runs all along the width of region 24. A heavily-doped P-type silicon region 54 (P+) crosses upper insulating layer 9 and forms a contact with region 52. A heavily-doped P-type silicon region 60 (P+) extends between region 52 and the portion of region 22 crossing areas 56 and 58. Trenches 6 follow the contour of the assembly formed of region 22, of region 24, of region 52, and of core 5.

The selection of the doping level of area 56 enables to adjust the value of the breakdown voltage of the PN junction between area 56 and core 5. Region 60 and the portion of region 22 form a Zener diode on a portion only of the PN junction, enabling to decrease the capacitance of the PN junction. It is possible to extend region 52 in portion 11 of core 5 to displace region 60 and the portion of region 22 crossing areas 56 and 58 to form the Zener diode on another portion of the PN junction between area 56 and core 5. Further, the features described in relation with FIGS. 7A, 7B, 7C, and 7D may be adapted to the previously-described embodiments of protection components of unidirectional or bidirectional Shockley diode type. In particular, for the bidirectional Shockley diode, the above-mentioned improvements of the PN junction between core 5 and region 22 may be applied to the PN junction between core 5 and region 24.

It should be noted that in the embodiment described in relation with FIGS. 7A, 7B, 7C, and 7D, between regions 22 and portion 11 of core 5, at least one area of the same conductivity type as region 22 but of different doping level is provided. In an optoelectronic technological process enabling to form optical waveguides, detection photodiodes, and fast phase modulators in a circuit on SOI, the dimensions of the different layers will be: from 200 to 400 nm, for example, 300 nm, for silicon layer 1, from 500 nm to 800 nm, for example, 700 nm, for oxide layer 2, and in the order of half the thickness of SOI layer 1 for upper oxide layer 9.

In an optoelectronic technological process, the forming of layers, areas, or regions having different doping levels is usually provided. Such areas, layers, or regions may be used to adjust the breakdown voltage of the protection components. The available doping concentrations will for example be: for P-type regions: from 1015 to 1016 at./cm$^3$ for lightly-doped SOI layer 1 (P−), in the order of 1017 at./cm$^3$, and greater than 1020 at./cm$^3$ for heavily-doped regions (P+); and for N-type regions: in the order of 1017 at./cm$^3$, in the order of 1018 at./cm$^3$ for region 58, in the order of 1019 at./cm$^3$ for region 56, and greater than 1020 at./cm$^3$ for heavily-doped regions (N+).

Specific embodiments have been described. Various alterations and modifications will occur to those skilled in the art. In particular, although the embodiments have been described in relation with a germanium photodiode, they also apply to other embodiments of photodiodes or to other optoelectronic components formed in the vicinity of a waveguide.

Further, the topography of the various elements may be modified by those skilled in the art. In particular, the thyristors and the triacs may have various topological variations. Moreover, the conductivity types indicated as an example in relation with the above embodiment may all be inverted. The doping levels and the different layer thicknesses indicated as an example may be adapted according to the different technological processes used.

Such alterations, modifications, and improvements are intended to be part of this disclosure, and are intended to be within the spirit and the scope of the present disclosure. Accordingly, the foregoing description is by way of example only and is not intended to be limiting. The present disclosure is limited only as defined in the following claims and the equivalents thereto.

That which is claimed is:

1. An overvoltage protection component for an optical device, the overvoltage protection component comprising:
   a silicon-on-insulator (SOI) layer;
   an optical waveguide core in said SOI layer, the optical device contacting with and being above said optical waveguide core; and
   a plurality of semiconductor regions in said SOI layer and adjacent said optical waveguide core;
   said optical waveguide core and said plurality of semiconductor regions defining alternating regions of at least one of different conductivity types and dopant concentration levels and providing overvoltage protection for the optical device.

2. The overvoltage protection component of claim 1 wherein said optical waveguide core has a first conductivity type; wherein said plurality of semiconductor regions comprises first and second regions of a second conductivity type different from the first conductivity type, said first and second regions being positioned on either side of said optical waveguide core; and wherein said first region, second region, and said optical waveguide core define a bipolar transistor.

3. The overvoltage protection component of claim 2 further comprising at least one area between said optical waveguide core and said first region, said at least one area having a same conductivity type as said first region and a different dopant concentration level than said first region.

4. The overvoltage protection component of claim 1 wherein said optical waveguide core has a first conductivity type; wherein said plurality of semiconductor regions comprises a first region, and a third region respectively of a second conductivity type and of the first conductivity type, the second conductivity type being different from the first conductivity type; wherein said first and third regions are positioned successively on a side of said optical waveguide core; wherein said plurality of semiconductor regions comprises a second region of the second conductivity type positioned on an other side of said optical waveguide core; and wherein said third region, said second region, said first region, and said optical waveguide core define a unidirectional Shockley diode.

5. The overvoltage protection component of claim 4 further comprising an upper insulating layer in said SOI layer, and a contacting region in said SOI layer above said first region and crossing said upper insulating layer, said contacting region defining a contact with said first region.

6. The overvoltage protection component of claim 1 wherein the optical waveguide core has a first conductivity type; wherein said plurality of semiconductor regions comprises a first region, and a third region respectively of a second conductivity type and of the first conductivity type, the second conductivity type being different from the first conductivity type; wherein said first and third regions are positioned successively on a side of said optical waveguide core; wherein said plurality of semiconductor regions comprises a second region and a fourth region of the second conductivity type and first conductivity type, respectively, positioned successively on an other side of said optical waveguide core; and wherein said fourth region, said third region, said second region, said first region, and said optical waveguide core define a bidirectional Shockley diode.

7. The overvoltage protection component of claim 1 further comprising a contact partly in said optical waveguide core and configured to bias the optical waveguide core.

8. The overvoltage protection component of claim 7 wherein said contact comprises a region of the same conductivity type as said optical waveguide core and having a greater dopant concentration level than said optical waveguide core.

9. An optoelectronic device comprising:
a photodiode; and
an overvoltage protection component coupled to said photodiode and comprising
a silicon-on-insulator (SOI) layer,
an optical waveguide core in said SOI layer, and
a plurality of semiconductor regions in said SOI layer and adjacent said optical waveguide core,
said optical waveguide core and said plurality of semiconductor regions defining alternating regions of at least one of different conductivity types and dopant concentration levels;
said photodiode contacting with and being above said optical waveguide core.

10. The optoelectronic device of claim 9 wherein said photodiode comprises a germanium photodiode.

11. The optoelectronic device of claim 9 wherein said optical waveguide core has a first conductivity type; wherein said plurality of semiconductor regions comprises a first region, and a second region of a second conductivity type different from the first conductivity type, said first and second regions being positioned on either side of said optical waveguide core; and wherein said first region, second region, and said optical waveguide core define a bipolar transistor.

12. The optoelectronic device of claim 11 further comprising at least one area between said optical waveguide core and said first region, said at least one area having a same conductivity type as said first region and a different dopant concentration level than said first region.

13. The optoelectronic device of claim 9 wherein said optical waveguide core has a first conductivity type; wherein said plurality of semiconductor regions comprises a first region, and a third region respectively of a second conductivity type and of the first conductivity type, the second conductivity type being different from the first conductivity type; wherein said first and third regions are positioned successively on a side of said optical waveguide core; wherein said plurality of semiconductor regions comprises a second region of the second conductivity type positioned on an other side of said optical waveguide core; and wherein said third region, said second region, said first region, and said optical waveguide core define a unidirectional Shockley diode.

14. The optoelectronic device of claim 13 further comprising an upper insulating layer in said SOT layer, and a contacting region in said SOI layer above said first region and crossing said upper insulating layer, said contacting region defining a contact with said first region.

15. The optoelectronic device of claim 9 wherein the optical waveguide core has a first conductivity type; wherein said plurality of semiconductor regions comprises a first region, and a third region respectively of a second conductivity type and of the first conductivity type, the second conductivity type being different from the first conductivity type; wherein said first and third regions are positioned successively on a side of said optical waveguide core; wherein said plurality of semiconductor regions comprises a second region and a fourth region of the second conductivity type and first conductivity type, respectively, positioned successively on an other side of said optical waveguide core; and wherein said fourth region, said third region, said second region, said first region, and said optical waveguide core define a bidirectional Shockley diode.

16. The optoelectronic device of claim 9 further comprising a contact partly in said optical waveguide core and configured to bias the optical waveguide core.

17. A method for making an overvoltage protection component for an optical device, the method comprising:
forming a silicon-on-insulator (SOI) layer;
forming an optical waveguide core in the SOI layer, the optical device contacting with and being above the optical waveguide core; and
forming a plurality of semiconductor regions in the SOI layer and adjacent the optical waveguide core;
the optical waveguide core and the plurality of semiconductor regions defining alternating regions of at least one of different conductivity types and dopant concentration levels and providing overvoltage protection for the optical device.

18. The method of claim 17 wherein the optical waveguide core has a first conductivity type; wherein the plurality of semiconductor regions comprises a first region, and a second region of a second conductivity type different from the first conductivity type, the first and second regions being positioned on either side of the optical waveguide core; and wherein the first region, second region, and the optical waveguide core define a bipolar transistor.

19. The method of claim 18 further comprising forming at least one area between the optical waveguide core and the first region, the at least one area having a same conductivity type as the first region and a different dopant concentration level than the first region.

20. The method of claim 17 wherein the optical waveguide core has a first conductivity type; wherein the plurality of semiconductor regions comprises a first region, and a third region respectively of a second conductivity type and of the first conductivity type, the second conductivity type being different from the first conductivity type; wherein the first and third regions are positioned successively on a side of the optical waveguide core; wherein the plurality of semiconductor regions comprises a second region of the second conductivity type positioned on an other side of the optical waveguide core; and wherein the third region, the second region, the first region, and the optical waveguide core define a unidirectional Shockley diode.

21. The method of claim 20 further comprising forming an upper insulating layer in the SOI layer, and a contacting region in the SOI layer above the first region and crossing the upper insulating layer, the contacting region defining a contact with the first region.

22. The method of claim 17 wherein the optical waveguide core has a first conductivity type; wherein the plurality of semiconductor regions comprises a first region, and a third region respectively of a second conductivity type and of the first conductivity type, the second conductivity type being different from the first conductivity type; wherein the first and third regions are positioned successively on a side of the optical waveguide core; wherein the plurality of semiconductor regions comprises a second region and a fourth region of the second conductivity type and first conductivity type, respectively, positioned successively on an other side of the optical waveguide core; and wherein the fourth region, the third region, the second region, the first region, and the optical waveguide core define a bidirectional Shockley diode.

23. The method of claim 17 further comprising forming a contact partly in the optical waveguide core and configured to bias the optical waveguide core.

24. The method of claim 23 wherein the contact comprises a region of the same conductivity type as the optical waveguide core and having a greater dopant concentration level than the optical waveguide core.

25. An optoelectronic device comprising:
an optical device; and
an overvoltage protection component coupled to said optical device and comprising
a silicon-on-insulator (SOI) layer,
an optical waveguide core in said 901 layer, and
a plurality of semiconductor regions in said SOI layer and adjacent said optical waveguide core,
said optical waveguide core and said plurality of semiconductor regions defining alternating regions of at least one of different conductivity types and dopant concentration levels;
said optical device contacting with and being above said optical waveguide core.

26. The optoelectronic device of claim 25 wherein said optical device comprises a germanium optical device.

27. The optoelectronic device of claim 25 wherein said optical waveguide core has a first conductivity type; wherein said plurality of semiconductor regions comprises a first region, and a second region of a second conductivity type different from the first conductivity type, said first and second regions being positioned on either side of said optical waveguide core; and wherein said first region, second region, and said optical waveguide core define a bipolar transistor.

* * * * *

UNITED STATES PATENT AND TRADEMARK OFFICE
CERTIFICATE OF CORRECTION

PATENT NO. : 9,530,922 B2  
APPLICATION NO. : 14/496192  
DATED : December 27, 2016  
INVENTOR(S) : Pascale Fonteneau

Page 1 of 1

It is certified that error appears in the above-identified patent and that said Letters Patent is hereby corrected as shown below:

In the Claims

| | |
|---|---|
| Column 7, Line 54, Claim 14 | Delete: "SOT" Insert --SOI-- |
| Column 9, Line 13, Claim 25 | Delete: "901" Insert --SOI-- |

Signed and Sealed this  
Twenty-eighth Day of March, 2017

Michelle K. Lee  
*Director of the United States Patent and Trademark Office*